(12) United States Patent
Husher

(10) Patent No.: US 6,891,249 B1
(45) Date of Patent: May 10, 2005

(54) METHOD AND SYSTEM FOR HIGH DENSITY INTEGRATED BIPOLAR POWER TRANSISTOR USING BURIED POWER BUSS

(75) Inventor: John Durbin Husher, Los Altos Hills, CA (US)

(73) Assignee: Micrel, Inc., San Jose, CA (US)

(*) Notice: Subject to any disclaimer, the term of this patent is extended or adjusted under 35 U.S.C. 154(b) by 44 days.

(21) Appl. No.: 10/170,156

(22) Filed: Jun. 11, 2002

(51) Int. Cl.[7] .................... H01L 27/082; H01L 27/102; H01L 29/70
(52) U.S. Cl. .................. 257/587; 257/591; 257/593
(58) Field of Search ................ 257/578, 565, 257/587, 588, 591, 593

(56) References Cited

U.S. PATENT DOCUMENTS 3,950,233 A * 4/1976 Rosvold ............... 205/123
5,637,911 A * 6/1997 Yamazaki ............. 257/587

* cited by examiner

Primary Examiner—Steven Loke
(74) Attorney, Agent, or Firm—Sawyer Law Group LLP

(57) ABSTRACT

A method and system for providing a bipolar power transistor on a semiconductor device is disclosed. The method and system comprise providing a semiconductor substrate. The method and system includes providing an emitter base structure in the power device. The method and system further includes providing at least one oxidized slot through the emitter base structure and into the semiconductor substrate utilizing the highly inefficient portion of the emitter for this structure, thus wasted space is utilized to provide a power buss ground. This results in a smaller transistor for a given current. This is provided without any extra steps. This approach results in lower operating temperatures for a given current as compared to standard approaches.

5 Claims, 8 Drawing Sheets

METHOD AND SYSTEM FOR HIGH DENSITY INTEGRATED BIPOLAR POWER TRANSISTOR USING BURIED POWER BUSS

FIELD OF THE INVENTION

The present invention relates to improving the density of an integrated circuit bipolar power transistor while providing high beta and beta over a broader current range.

BACKGROUND OF THE INVENTION

FIG. 1 illustrates a cross section of a typical integrated circuit power transistor 100. A plurality of power transistors provides a "Christmas tree" structure of a "snake curving" structure. An examination of where the current flows and where it does not flow shows that the current flow is mainly confined to the outer edge of the emitter/base. This is due to the biasing of the emitter base 102. Voltage applied to the emitter base ($V_a$) leads of the transistor result in this voltage $V_a$ appearing at the very edge noted as point "X. This results in a current flowing in the emitter edge ($I_e$) across the base to the collector with a small percentage of the emitter current flowing in the base lead (1–alpha times the emitter current, where alpha is almost 1) and resulting in current in the collector of almost all the $I_e$.

A small distance inwards from the edge of the base, the applied voltage is lower than $V_a$ due to the slight current flow in the base flowing across a very high resistance due to the pinching effect of the very thin base region. As one moves a little further under the emitter base junction from the edge, the voltage drop is a little higher and the voltage is now $V_a$ minus some additional millivolts of drop, therefore biasing this portion of the emitter base junction lower. The resultant emitter current injected drops dramatically at these points located inwards from the emitter base edge. For example, the current will drop as much as a decade for every 60 mv of drop. Therefore just a short distance in from the edge of the emitter base junction, the current flow is very low; i.e. most of the current is flowing at the edge of the emitter base. FIG. 2 is meant to show that only a small portion of the emitter base 102 is contributing to emitter current that can be collected by the collector. In essence, the cross-section of the transistor shown in FIG. 1 results in current flow that is pictured in FIG. 2. It is obvious from this representative figure that most of the emitter base is not participating in the active current of the emitter and the collector and its resultant beta (gain of the bipolar transistor). Most of the emitter base junction is wasted space.

What is desired is to allow the inactive portion of the emitter base to be put to better use and therefore result in significant saving of space among its attributes.

The present invention addresses such a need.

SUMMARY OF THE INVENTION

A method and system for providing an integrated bipolar power transistor on a semiconductor device is disclosed. The method and system comprise providing a semiconductor substrate. The method and system includes providing an emitter base structure in the power device. The method and system further includes providing at least one slot through the middle of the emitter base structure and into the semiconductor substrate. Finally, the method and system includes oxidizing the at least one slot; and providing a metal within the at least one slot.

1. The advantages mentioned result in reduction of size for a given current of operation, therefore resulting in an increased device or circuit density for a given function.

2. The isolation masking and the long high temperature isolation diffusion process steps are eliminated.

3. The sinker masking and the long high temperature sinker diffusion are eliminated.

4. Other than the initial elevated temperatures for the buried layer and the epitaxial growth, the process becomes a very low temperature process. In most cases the emitter and base are processed using implants followed by rapid thermal processing (RTP). This elimination of high temperatures results in improved control, reduced stress, and reduced current leakage.

5. An oxide isolated structure results in place of a junction isolated structure, without added steps, thereby providing for all other isolation to be grounded by metal with a very low ground resistance.

6. Because the metal in the emitter is completely through the emitter and localized at the emitter it results in a lower resistance emitter and helps to prevent the de-biasing at high current levels. This also helps to reduce ground noise.

7. Metal is 7.5 $\mu$m thick in this example and 5 $\mu$m wide. This provides an extremely low drop in voltage in this metal structure. The approach is maskless and only requires one to do an interconnect mask on the 1C metal. The result is equivalent to a dual metal structure without the added processing required for a dual metal.

8. Heat transfer is ten times better than through oxide and 200 times better than through air. In this structure, a significant portion of the heat is carried through the silicon and/or from silicon to oxide. This improved heat transfer results in the device running cooler than standard approaches.

9. Electromigration is essentially eliminated.

10. Secondary breakdown, which is a function of the operating temperature, is increased in voltage due to the cooler structure at any power level compared to conventional approaches.

11. Ground metal does not have to be routed since the metalized and oxidized slots for ground points can be placed anywhere in the device layout. Ground is connected through these and the substrate. This results in a savings of space.

12. Since a double metal structure is provided without the added complexity and yield loss of a second metal processing, the approach provides greater design and layout flexibility without suffering the costs of added processing. Design and layout time are reduced considerably.

13. Since only the efficient part of the emitter is utilized, the beta is higher at any given current level of operation.

14. The beta versus collector current holds up over a broader current range due to the falloff at higher currents being less than the standard approach. This is a reflection of the lower loss due to lower emitter resistance and the improved emitter efficiency at higher current.

15. The description is of an NPN integrated transistor in a bipolar application. However, this approach is applicable in a BiCmos application, a DMOS application or any other application that may mix bipolar power transistors with other technologies.

DETAILED DESCRIPTION

The present invention relates to improving the density of an integrated circuit bipolar power transistor while providing high beta and beta over a broader current range. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein. Though an NPN transistor is described in the integrated circuit, this approach works just as well on a PNP vertical transistor where the N and P dopants are interchanged.

Process

The processing of the integrated circuit bipolar power transistor is essentially the standard approach up to the point where contact openings and metal are placed on the device. Herein, below, the processing of the transistor will be reviewed as it pertains to an NPN structure; however, this approach is also pertinent to the PNP power transistor and only the reverse polarity of each P or N type is used.

First, a starting material of high resistivity P type material is provided. Next, a low sheet resistance buried layer is provided (N+). Thereafter, a high resistivity N type material is epitaxially grown. The normal step of providing the P isolation masking and the P isolation diffusion are eliminated. In addition, if a sinker is to be supplied, the masking and the high temperature long diffusion are eliminated. Next, the base and the emitter are processed.

Figure 1:
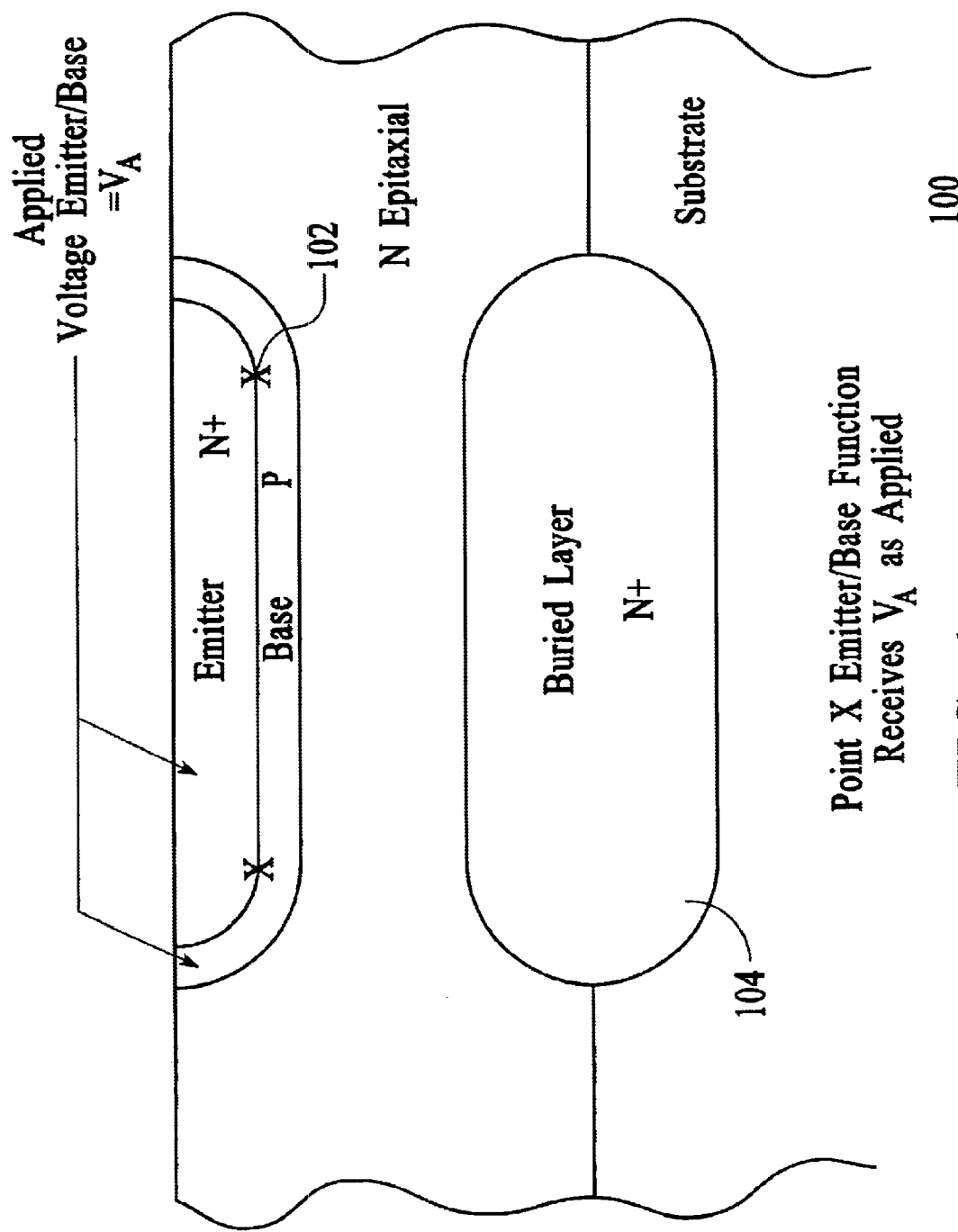
FIG. 1 illustrates a cross-section of an integrated power transistor.
Figure 2:
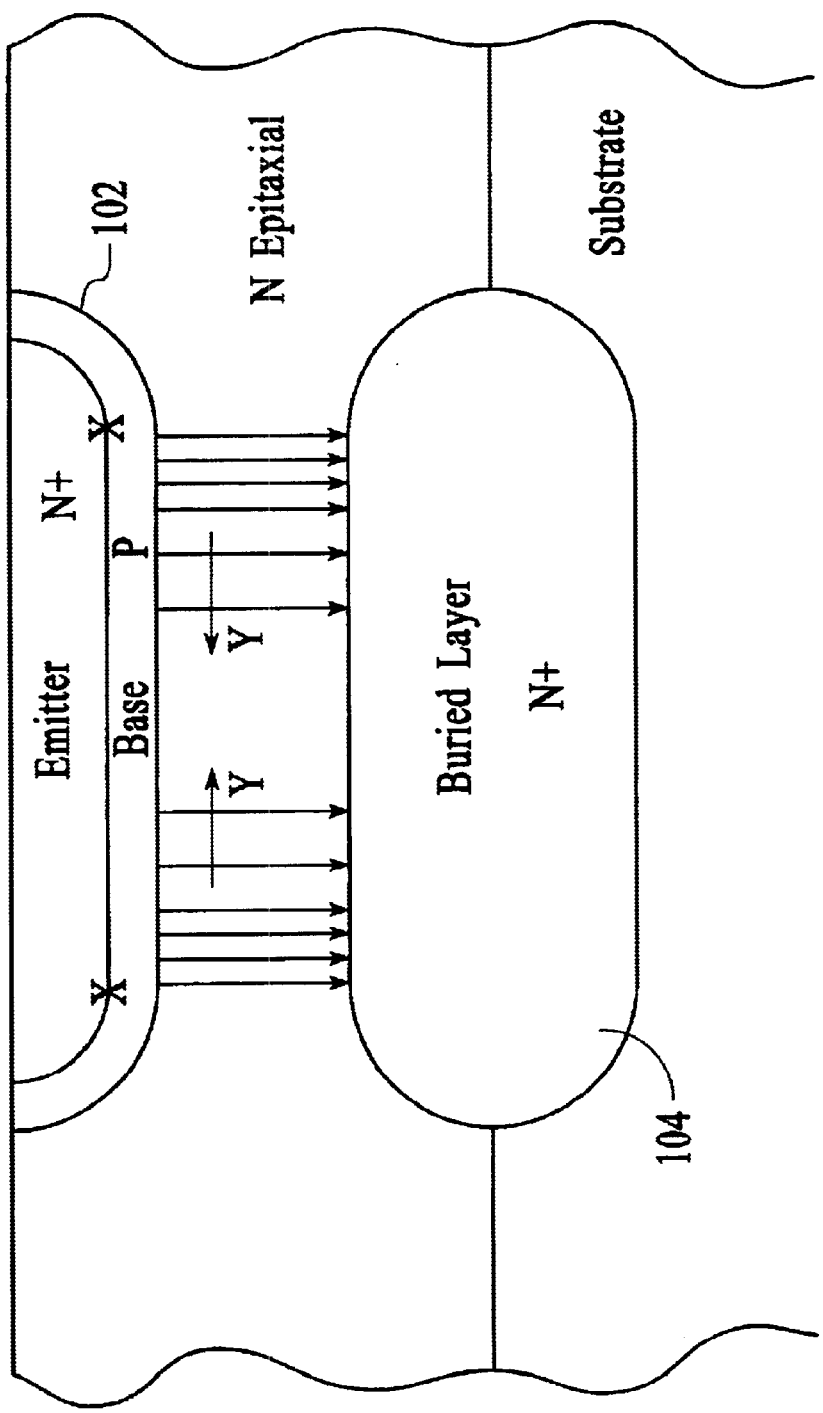
FIG. 2 illustrates the current flow across the emitter base to the collector of the power transistor of FIG. 1.
Figure 3:
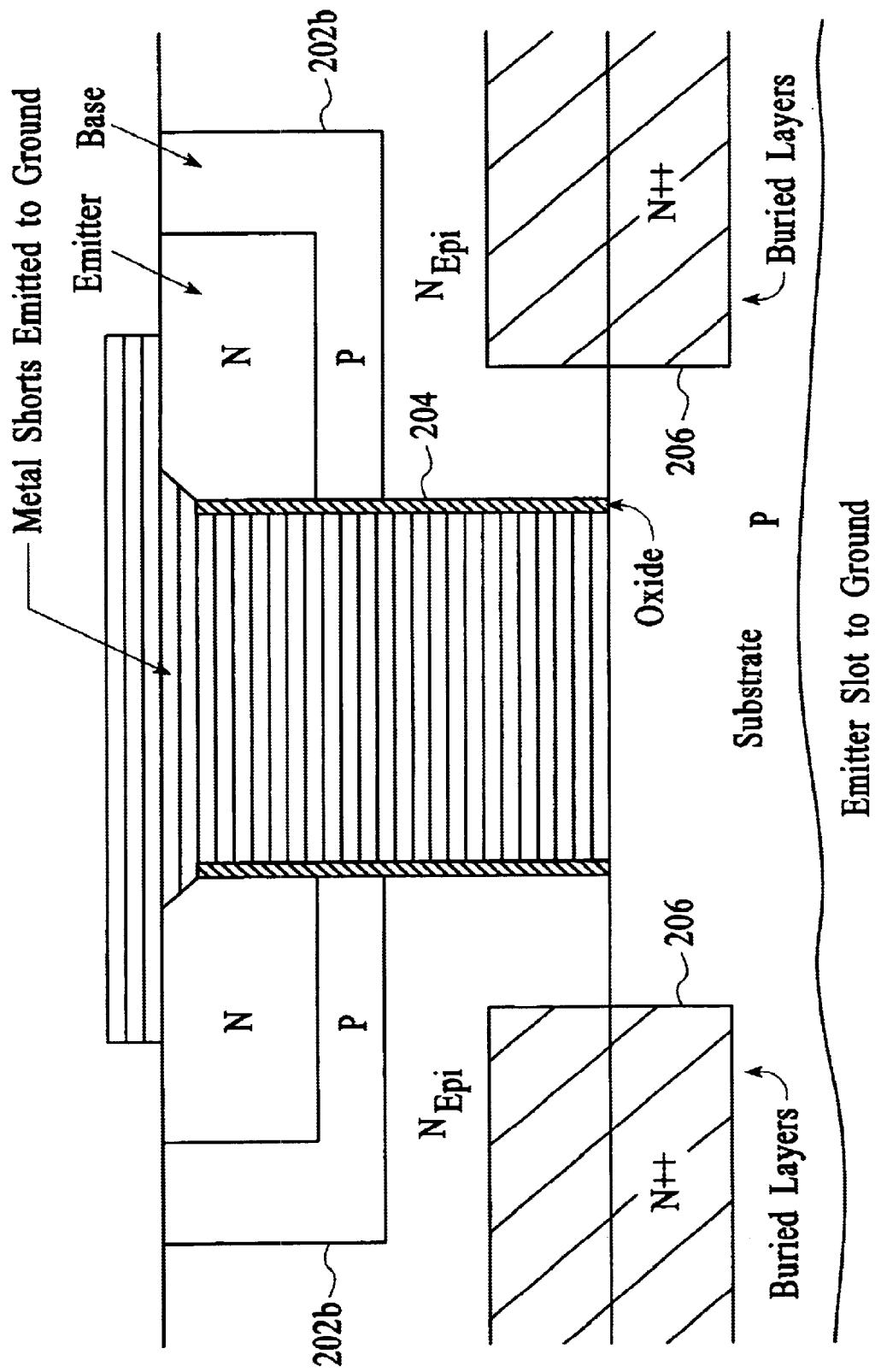
FIG. 3 illustrates a cross-section of an integrated power transistor with an emitter shorted to ground by means of a metalized, oxidized slot.
Figure 4:
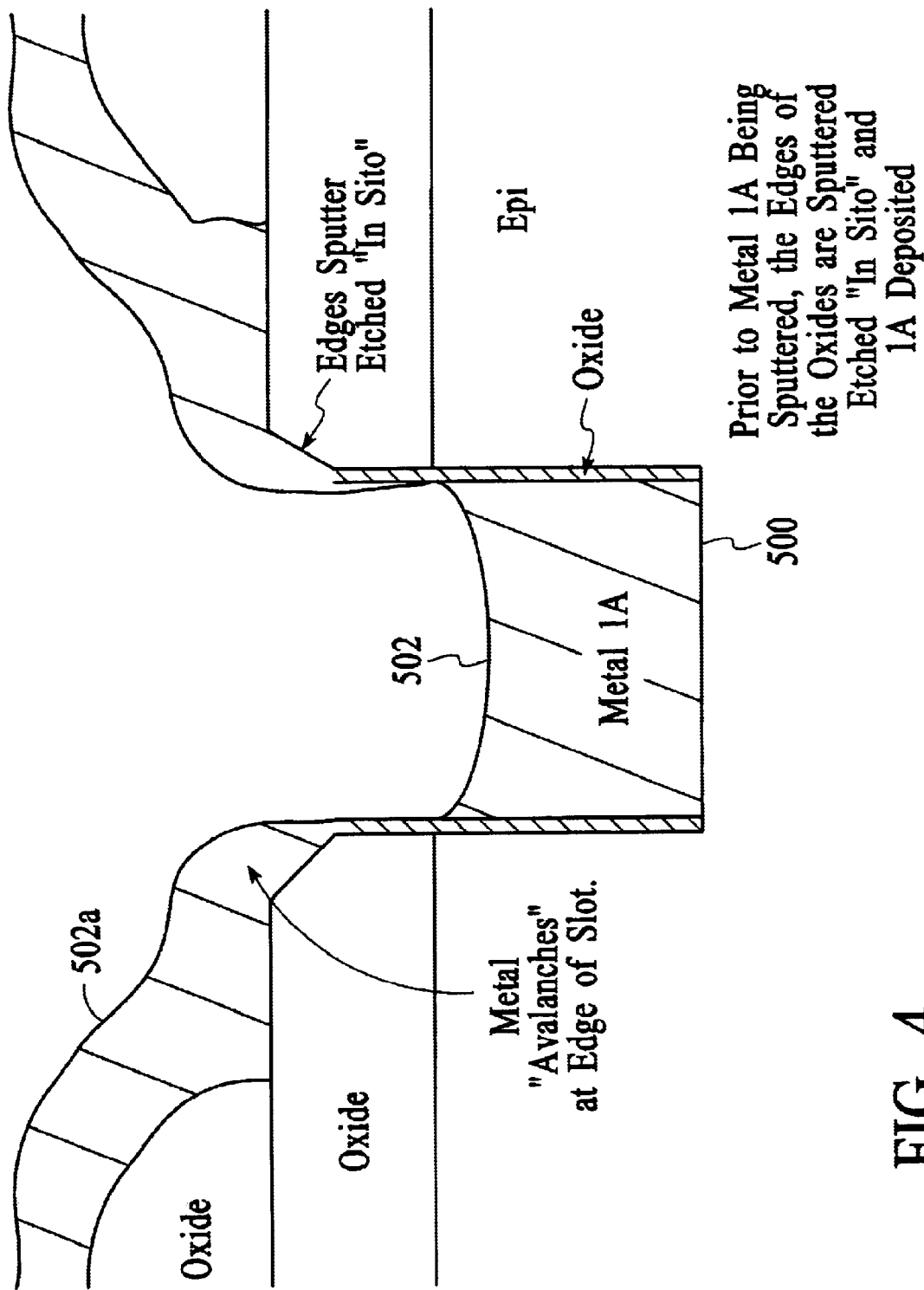
FIGS. 4–8 illustrate an oxidized and metalized slot at various stages of metal deposition and build up during the formation of the power transistor.

At this point the process differs from the standard process. First, slots of a one to one (depth to width) perspective are etched. In this example a slot 5 $\mu$m wide and 5 $\mu$m deep will be dry etched into the device. The slots are then oxidized either thermally or by deposition of a dielectric. These dielectric coated slots, when metalized, will eventually provide all the grounds required, the power buss, the sinkers, the isolation and a grounded emitter. These slots are all formed simultaneously in one masking and etching process. FIG. 3 illustrates a cross-section of a power transistor in accordance with the present invention displaying the oxidized slot cut through the middle of the emitter and down through the base to the substrate. These slots are provided through a buried power buss approach. This approach is described in U.S. patent application Ser. No. 10/034,184, entitled "Buried Power Buss for High Current, High Power Semiconductor Devices and a Method for Providing the Same," filed in Dec. 28, 2001, and assigned to the assignee of the present application. The above-identified patent application describes a method and system for providing an interconnect on a semiconductor device, and is incorporated in its entirety herein. The method and system comprises providing a semiconductor substrate with a plurality of device structures thereon and providing at least one slot in the semiconductor substrate. The interconnect method and system include providing a metal within the at least one oxidized slot.

This interconnect scheme is utilized to advantage to provide a power transistor device which has improved performance. After the emitter slot is etched, it is oxidized thermally or by deposition of a dielectric. The oxide is etched out of the bottom of the emitter slot and wherever ground slots are to be located, for example, by using dry anisotropic etching procedures. Since in this example the emitter is going to be grounded, the slot that goes through the emitter also has its oxide removed at the bottom of the slot. To illustrate this process in the context of the power transistor refer now to the following.

Figure 5:
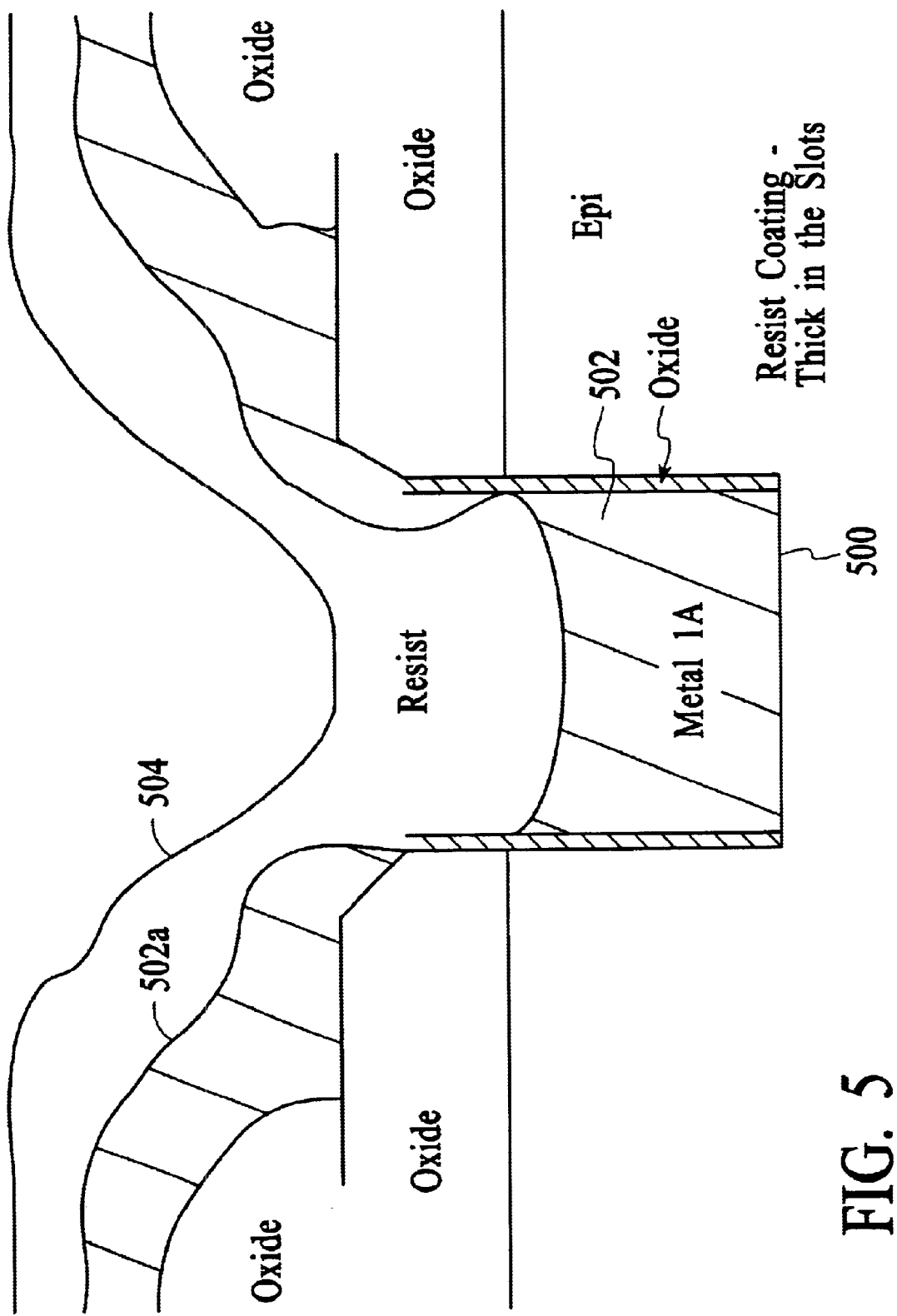
Figure 6:
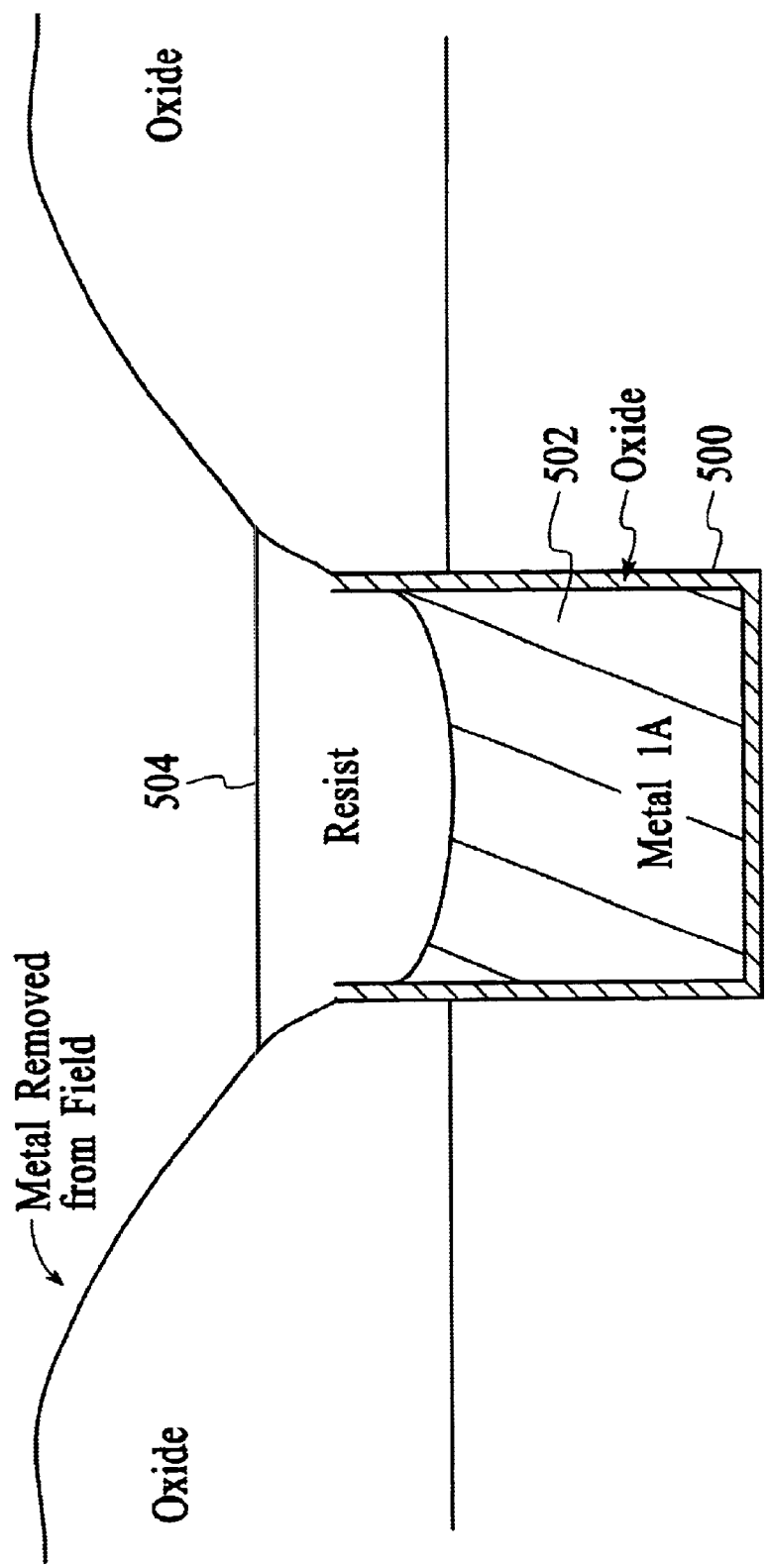
Figure 7:
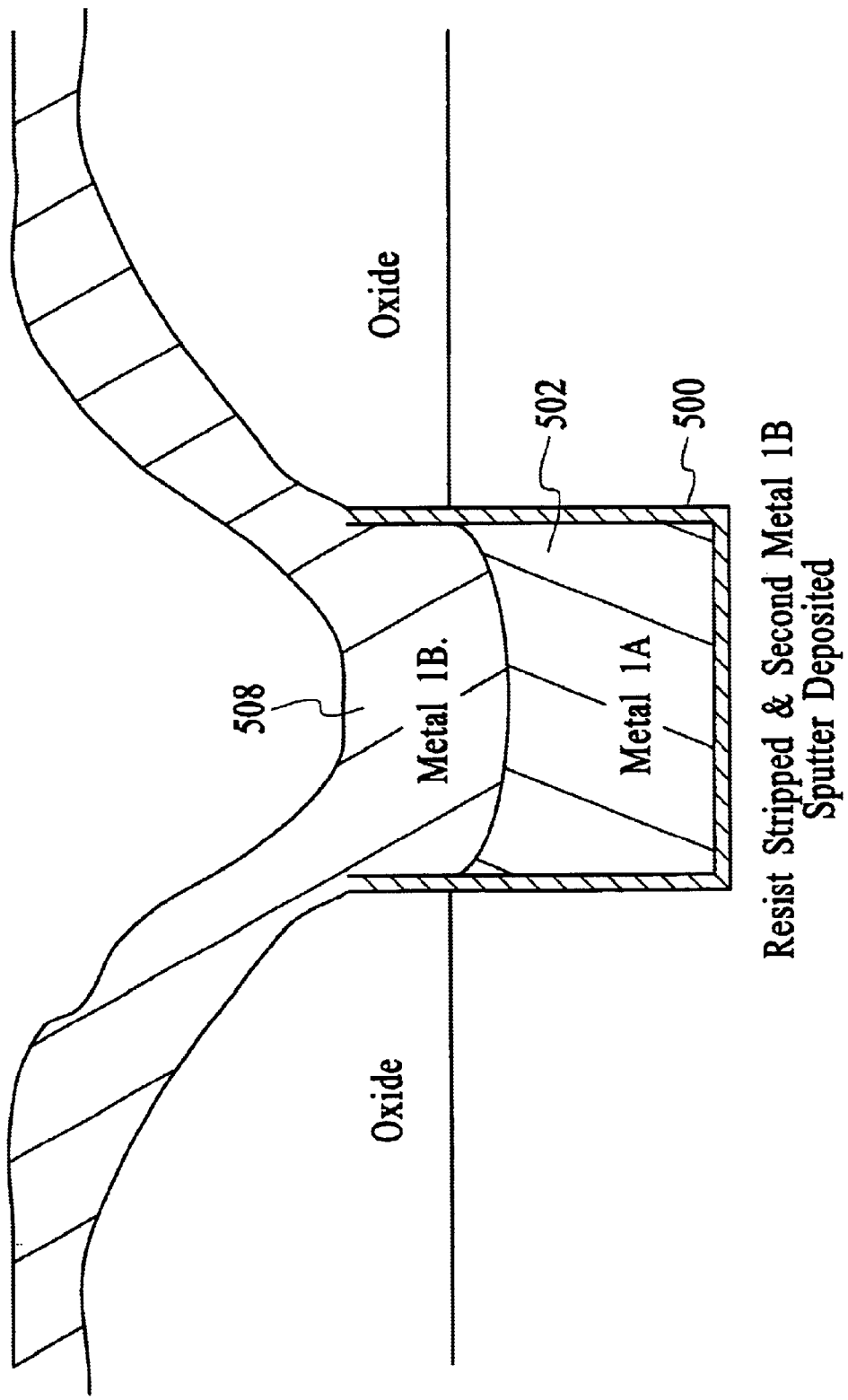
Figure 8:
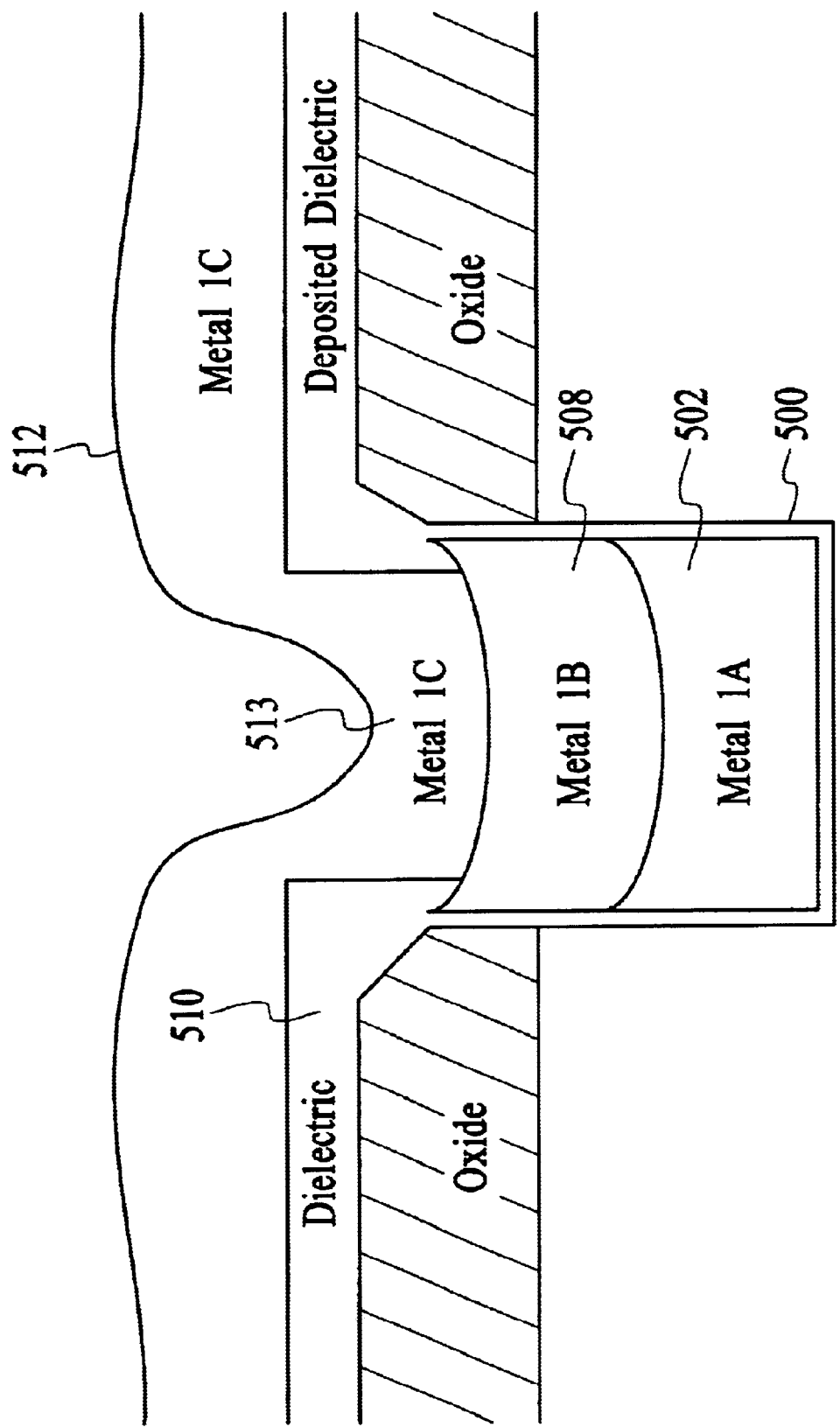

FIGS. 4–8 illustrate a slot at various stages during the formation of the power transistor. First, a metal (1A) 502 that is 2.5 $\mu$m thick is deposited on the wafer. This is followed by a layer of resist 504 as illustrated in FIG. 5. The wafers are then planarized (etched) to eliminate the resist and metal in the fields. Since the resist is much thicker in the slots where will be some resist remaining over the metal (1A) 502 in the slot as shown in FIG. 6. This resist is stripped. Thereafter, a metal (1B) 508 that is 2.5 $\mu$m thick is deposited on the wafer as shown in FIG. 7. This is followed by a layer of resist. The wafers are again planarized (etched) to eliminate the resist and the metal in the field oxide with some resist remaining in the slot over metal 1A and 1B. This resist is stripped. This essentially fills the slots with metal. A dielectric is then deposited. For example, TEOS could be utilized as the dielectric. A normal contact masking is used to open contacts where the next metal is to make contact. This will include the normal interconnect contacts plus contacting the slots. The slots will receive numerous contact openings of the same size as the standard contacts, over the total slot lengths. Metal that is, for example, 2.5 $\mu$m thick is deposited (metal 1C) on the wafers as shown in FIG. 8. This metal would have the same thickness as the standard process uses to make its interconnects. This allows the standard metal etching process to be used for the interconnect masking. This example has slots of one width and thickness, however the slots could be made much deeper and this will allow the metal thickness to be increased significantly to further lower its resistance and the resulting Ron. An example would be slots of 25 $\mu$m thick. Metal could be deposited in 2.5 $\mu$m increments with each being followed by a planarizing step to remove the resist and metal in the field while filling the slots. After 10 depositions and planarization steps there would be approximately 25 $\mu$m of metal in the slots. This would be followed by a dielectric deposition, contact openings and the final interconnect metal deposition. This would result in 27.5 $\mu$m of metal in the slots, 2.5 $\mu$m of metal interconnected and the width of the slots could be chosen by the designer. The widths could be 5 $\mu$m, 7.5 $\mu$m or wider if so determined.

Thereafter, the normal interconnect masking is implemented. This will result, in this example, in a metal of 2.5 $\mu$m (metal 1C) connecting most of the device circuitry together as well as tying into the buried power buss that is buried in the silicon, thus connecting in the grounds, power, sinker, and the emitter slots in the power transistor. There is now approximately 7.5 $\mu$m of metal in the slots. The sinker metal goes to the buried layer which has diffused upward from its original position. This provides a 7.5 $\mu$m thickness of metal directly to the buried layer and results in a very low collector metal resistance that is approximately two decades lower than a normal sinker resistance, thus lowering the Ron.

The ground metals, which are surrounded by an oxide sleeve, serve two purposes. They provide metal of 7.5 $\mu$m thickness to the substrate to provide a very low ground resistance. The grounds are normally implanted with boron when the buried layers are implanted. They therefore have moved up in the silicon and will meet the metal slot grounds that have the slot oxide removed from the bottom of the slots. Prior to removing the oxide at the bottom of the slots boron may be implanted into those slots where one wants to ensure low resistance metal contact to P regions. It may be necessary to place N+ implants into regions where the metal is to make contact to the buried layer.

The oxide isolated ground slots are used throughout where grounds are desired and surround islands that need to be isolated from adjacent active area islands. Where a power buss must proceed from one isolated island to the adjacent ones, it uses metal 1C with the dielectric separating it from the 1B metal. This results in all islands having three layers of metal surrounding them except where this power buss bridges over. At this point there are three layers of metal but there is a dielectric between the 1C and 1B layers. This is to allow passage of the power buss from one island to the next without communicating with ground. This bridging occurs over a very small area of approximately 5 $\mu$m×5 $\mu$m (25 $\mu$m^2) and therefore represents a very small capacitance to ground.

Summary

A review of the power transistor as shown in FIG. 3 shows the grounded emitter metal in the slots through the middle of the emitter to the substrate. This leaves only the edges of the emitter base structure to inject current that is collected by the collector. This is the area of the transistor that was previously mentioned as the "only" area actively injecting current and the rest of the emitter base junction was essentially dormant. So the dormant area is now replaced with a metalized (and oxide isolated) slot that goes directly to ground. This means that no provision needs to be made for providing a metal path to the emitters. At the same time the sinker with its oxide "garment" can be moved right up against the base since it has the oxide to insulate it from the active base. Therefore, the size of the transistor is reduced considerably.

Likewise, isolation is provided by metalized, oxidized slots that go to ground (substrate). These are provided anywhere a ground is required and in this case provide a path directly through where the inactive part of the power transistor's emitter used to be. Thus the "inactive" portion of the emitter base is now eliminated and is used to provide the grounded emitter heavy metal buss. The isolation metal is in its oxide "garment" and can be moved up close to the sinker since it is insulated from the sinker by the dielectric. The normal junction isolation that was dropped usually uses up a very significant amount of area since it diffuses sideways as it diffuses down to the substrate. Because of this, in a standard approach a significant distance must be left between the isolation and the base as well as the isolation and the buried layer. In this approach this restriction is eliminated since the isolation is restricted to the 5 $\mu$m oxidized slot and this can be moved right up against the sinker or base due to the dielectric isolation. This reduces the size of the transistor considerably.

Since provisions for the sinker to collector and emitter to ground have been made using the buried slots, one only has to determine how to accommodate contacting the base of the device. This contacting is accomplished using the 1C metal which has the dielectric between the 1C metal and 1B metal as well as any other active circuitry. Contact openings are made for the base using the standard approach.

1. The advantages mentioned result in a significant reduction of size for a given current of operation. Therefore the increased circuit density for a given function.

2. The isolation masking and the long high temperature isolation diffusion are eliminated.

3. The sinker masking and the long high temperature sinker diffusion are eliminated.

4. Other than the initial elevated temperatures for the buried layer and the epitaxial growth, the process is now a very low temperature process. In most cases the emitter and base are processed using implants followed by rapid thermal processing (RTP). This elimination of high temperatures results in improved control, reduced stress, and reduced current leakage.

5. An oxide isolated structure is formed that provides emitter grounding and all other isolated grounding by metal with a very low ground resistance.

6. Because the metal in the emitter is completely through the emitter and localized at the emitter, it results in a lower resistance emitter and helps to prevent the de-biasing at high current levels. This results in the Ron (on resistance of the transistor) to be lower. This also helps to reduce ground noise.

7. Metal is 7.5 $\mu$m thick in this example and 5 $\mu$m wide. This provides an extremely low drop in voltage in this metal structure. The approach is maskless and only requires a normal interconnect mask on the 1C metal via much thinner metal.

8. Heat transfer is ten times better than through oxide and 200 times better than through air. In this structure a significant portion of the heat is carried through the silicon and much from silicon to oxide. This improved heat transfer results in the device running cooler than standard approaches.

9. Electromigration is essentially eliminated.

10. Secondary breakdown, which is an inverse function of the operating temperature, is increased in voltage due to the cooler structure.

11. Grounds do not have to be routed since the metalized and oxidized slots can be placed anywhere. Where ground is required the oxide is removed at the bottom of these slots and metal connected through these to the substrate. This results in a significant savings of space.

12. Since a double metal structure is provided without the added complexity and yield loss of a second metal processing, the approach provides greater design and layout flexibility without suffering the costs of added processing. The result is a double metal structure without requiring a via masking and etching and without depositing the normal dielectric between metals for the dual metal structure.

13. Since only the efficient part of the emitter is utilized, the beta is higher at any given current level of operation.

14. The beta versus collector current holds up over a broader current range due to the falloff at higher currents being less than the standard approach. This is a reflection of the lower loss due to lower emitter resistance and the improved emitter efficiency at higher current.

15. The description is of an NPN integrated transistor in a bipolar application. However, this approach is applicable in a BiCmos application, a DMOS application or any other application that may mix bipolar power transistors with other technologies.

16. Because the sinker, as well as the emitter, resistance is lowered due to the metalized structures created there is a much lower Ron of the transistor.

17. Due to the reduction in size for a given operating condition, the yield is improved. Yield is an inverse function of device size.

18. Due to the lower resistance and smaller size there is a reduction in Ron X area which is a critical parameter for power devices.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A bipolar power transistor comprising:

a semiconductor substrate, the semiconductor substrate including an emitter base structures thereon; wherein the semiconductor substrate comprises: a substrate region; and a buried layer, and an epitaxial (EPI) layer over the substrate region, wherein the emitter base structure is provided in the EPI layer; and at least one slot provided in the semiconductor substrate and at least one metal within the slot, the at least one slot being oxidized; wherein the at least one metal comprises a plurality of metals; and wherein the plurality of metals comprises two metals, a first metal covers one-half of the slot and a second metal fills the slot; wherein an emitter-structure can be grounded with a very low ground resistance.

2. The power transistor of claim 1 wherein the plurality of metals comprises three metal depositions, wherein the first and second deposition of metal fill the slot and a third metal deposition provides the interconnect layer wherein a dielectric layer is between the third and second metals.

3. The power transistor of claim 1 wherein a low resistance emitter is provided with minimal debiasing at high current times.

4. The power transistor of claim 1 wherein there is a lower on resistance (Ron) of the transistor due to the metal within the slot.

5. The power transistor of claim 1 wherein there is a lower on resistance (Ron) due to the small size of the transistor.

* * * * *